(12) United States Patent
Ferry et al.

(10) Patent No.: US 6,579,362 B2
(45) Date of Patent: Jun. 17, 2003

(54) HEAT SHIELD ASSEMBLY FOR CRYSTAL PULLER

(75) Inventors: Lee W. Ferry, St. Charles, MO (US); Richard G. Schrenker, Chesterfield, MO (US); Mohsen Banan, Grover, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 63 days.

(21) Appl. No.: 09/815,508

(22) Filed: Mar. 23, 2001

(65) Prior Publication Data

US 2002/0134302 A1 Sep. 26, 2002

(51) Int. Cl.$^7$ ................................................ C30B 15/20
(52) U.S. Cl. ........................ 117/208; 117/213; 117/217
(58) Field of Search ................................. 117/208, 213, 117/217

(56) References Cited

U.S. PATENT DOCUMENTS

| | | |
|---|---|---|
| 5,316,742 A | 5/1994 | Tomioka et al. |
| 5,441,014 A | 8/1995 | Tomioka et al. |
| 5,567,399 A | 10/1996 | Von Ammon et al. |
| 5,827,367 A * | 10/1998 | Wijaranakula et al. ..... 117/208 |
| 6,036,776 A | 3/2000 | Kotooka et al. |
| 6,117,402 A | 9/2000 | Kotooka et al. |
| 6,197,111 B1 * | 3/2001 | Ferry et al. .................. 117/200 |
| 6,340,392 B1 * | 1/2002 | Park ............................. 117/13 |

FOREIGN PATENT DOCUMENTS

| | | |
|---|---|---|
| EP | 0 725 169 A1 | 8/1996 |
| JP | 1145391 | 6/1989 |
| JP | 6-305884 | * 11/1994 |
| JP | 2528309 B2 | 8/1996 |
| WO | WO 00 50671 A | 8/2000 |

OTHER PUBLICATIONS

International Search Report from the European Patent Office dated Aug. 9, 2002.

* cited by examiner

Primary Examiner—Robert Kunemund
(74) Attorney, Agent, or Firm—Senniger, Powers, Leavitt & Roedel

(57) ABSTRACT

A heat shield assembly for use in a crystal puller has an outer reflector interposed between the ingot and the crucible as the ingot is pulled from the molten source material. A cooling shield is interposed between the ingot and the outer reflector whereby the cooling shield is exposed to heat radiated from the ingot for increasing the rate at which the ingot is cooled, thereby increasing the axial temperature gradient of the ingot. In a further embodiment, an inner shield panel is disposed generally intermediate the cooling shield and the ingot in radially spaced relationship with the cooling shield and is constructed of a material substantially transparent to radiant heat from the ingot.

14 Claims, 3 Drawing Sheets

HEAT SHIELD ASSEMBLY FOR CRYSTAL PULLER

BACKGROUND OF THE INVENTION

The present invention relates to a crystal puller for growing single crystal semiconductor material, and more particularly to a heat shield assembly incorporated in a crystal puller for growing such crystals at elevated pull rates.

Single crystal semiconductor material, which is the starting material for fabricating many electronic components, is commonly prepared using the Czochralski ("Cz") method. In this method, polycrystalline semiconductor source material such as polycrystalline silicon ("polysilicon") is melted in a crucible. Then a seed crystal is lowered into the molten material (often referred to as the melt) and slowly raised to grow a single crystal ingot. As the ingot is grown, an upper end cone is formed by decreasing the pull rate and/or the melt temperature, thereby enlarging the ingot diameter, until a target diameter is reached. Once the target diameter is reached, the cylindrical main body of the ingot is formed by controlling the pull rate and the melt temperature to compensate for the decreasing melt level. Near the end of the growth process but before the crucible becomes empty, the ingot diameter is reduced to form a lower end cone which is separated from the melt to produce a finished ingot of semiconductor material.

To increase throughput of the crystal puller, it is desirable to increase the pull rate "v" at which the crystal is pulled up from the melt. However, simply increasing the pull rate, by itself, can be detrimental to the growth and quality of the crystal. For example, an increase in pull rate can result in distortion of the ingot diameter if the ingot is not given sufficient time to cool and solidify as it is pulled up from the melt.

Also, some wafer quality characteristics, such as Gate Oxide Integrity, are effected by a change in pull rate. Silicon wafers sliced from the ingot and manufactured according to conventional processes often include a silicon oxide layer formed on the surface of the wafer. Electronic circuit devices such as MOS devices are fabricated on this silicon oxide layer. Defects in the surface of the wafer, caused by the agglomerations present in the growing crystal, lead to poor growth of the oxide layer. The quality of the oxide layer, often referred to as the oxide film dielectric breakdown strength, may be quantitatively measured by fabricating MOS devices on the oxide layer and testing the devices. The Gate Oxide Integrity (GOI) of the crystal is the percentage of operational devices on the oxide layer of the wafers processed from the crystal.

One way to improve GOI is to control the number of vacancies grown into the ingot upon solidification of the ingot as it is pulled up from the melt. It is understood that the type and initial concentration of vacancies and self-interstitials, which become fixed in the ingot as the ingot solidifies, are controlled by the ratio of the growth velocity (i.e., the pull rate v) to the local axial temperature gradient in the ingot at the time of solidification ($G_o$). When the value of this ratio ($v/G_o$) exceeds a critical value, the concentration of vacancies increases. Thus, to inhibit an increase in the concentration of vacancies, i.e., to avoid increasing the ratio $v/G_o$, the axial temperature gradient at the solid-liquid interface must be correspondingly increased if the pull rate v is increased.

To this end, U.S. Pat. No. 5,316,742 discloses a single crystal puller apparatus having, as shown in FIG. 3 thereof, a first (outer) screen in the growth chamber arranged for surrounding the growing ingot as it is pulled up from the melt. The outer screen is constructed of silicon carbide coated graphite. A layer of insulating material constructed of carbon felt covers the inner surface of the outer screen. A second (inner) screen is arranged to surround the growing ingot intermediate the ingot and the outer screen in spaced relationship with the outer screen and insulating material. The inner screen is disclosed as being constructed of graphite (i.e., carbon). A cooling system comprising a pipe is wound around the inner screen for carrying cooling fluid therethrough to cool the inner screen. Accordingly, less heat is radiated by the screen toward the growing ingot, thereby increasing the axial temperature gradient of the ingot as it is pulled up from the melt. However, graphite has a high coefficient of radiation and, as such, a substantial amount of radiant heat from the growing ingot radiated to the inner screen is radiated back toward the ingot instead of being transferred to the cooling system. Thus, the crystal puller apparatus disclosed in this patent is not as efficient as desired.

SUMMARY OF THE INVENTION

Among the several objects and features of the present invention may be noted the provision of a heat shield assembly for a crystal puller which facilitates the growth of monocrystalline ingots from molten semiconductor source material at elevated pull rates; the provision of such a heat shield assembly which increases the axial temperature gradient of the monocrystalline ingot at the liquid-solid interface; and the provision of such a heat shield assembly which is shielded against molten silicon splashed from a source of molten silicon in the crystal puller and provides some protection against damage caused by inadvertent immersion of the heat shield assembly in the molten silicon.

In general, a heat shield assembly of the present invention for use in a crystal puller for growing a monocrystalline ingot from molten semiconductor source material comprises an outer reflector interposed between the ingot and the crucible as the ingot is pulled from the molten source material. A cooling shield is interposed between the ingot and the outer reflector as the ingot is pulled from the molten source material. The cooling shield is exposed to heat radiated from the ingot for increasing the rate at which the ingot is cooled, thereby increasing the axial temperature gradient of the ingot as the ingot is pulled from the molten source material. The outer reflector generally shields the cooling shield from heat radiated by the crucible.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
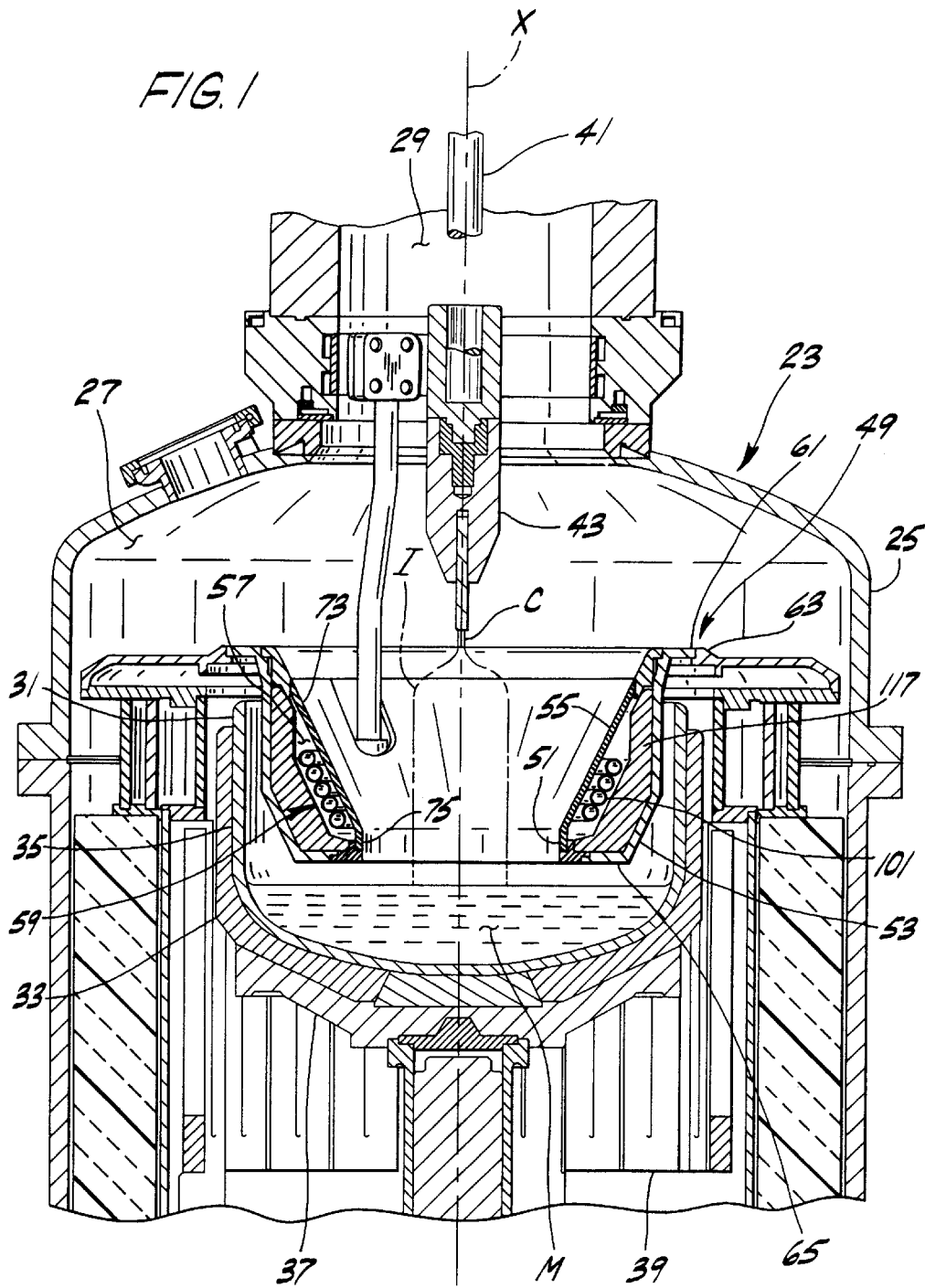
FIG. 1 is a fragmentary vertical cross-section of a crystal puller incorporating a heat shield assembly of the present invention.

Referring now to the drawings and in particular to FIG. 1, a crystal puller of the present invention of the type used to grow moncrystalline silicon ingots (e.g., ingot I shown in phantom in FIG. 1) according to the Czochralski method is generally designated in its entirety by the reference numeral 23. The crystal puller 23 includes a water cooled housing, generally indicated at 25, for isolating an interior which includes a lower crystal growth chamber 27 and an upper pull chamber 29 having a smaller transverse dimension than the growth chamber. A quartz crucible 31 seated in a susceptor 33 has a cylindrical side wall 35 and contains molten semiconductor source material M from which the monocrystalline silicon ingot I is grown. The susceptor 33 is mounted on a turntable 37 for rotation of the susceptor and crucible 31 about a central longitudinal axis X. The crucible 31 is also capable of being raised within the growth chamber 27 to maintain the surface of the molten source material M at a generally constant level as the ingot I is grown and source material is removed from the melt. A resistance heater 39 surrounds the crucible 31 for heating the crucible to melt the source material M in the crucible. The heater 39 is controlled by an external control system (not shown) so that the temperature of the molten source material M is precisely controlled throughout the pulling process.

A pulling mechanism includes a pull shaft 41 extending down from a mechanism (not shown) capable of raising, lowering and rotating the pull shaft. The crystal puller 23 may have a pull wire (not shown) rather than a shaft 41, depending upon the type of puller. The pull shaft 41 terminates in a seed crystal chuck 43 which holds a seed crystal C used to grow the monocrystalline ingot I. The pull shaft 41 has been partially broken away in FIG. 1, both at its top and where it connects to the chuck 43. In growing the ingot I, the pulling mechanism lowers the seed crystal C until it contacts the surface of the molten source material S. Once the seed crystal C begins to melt, the pulling mechanism slowly raises the seed crystal up through the growth chamber 27 and pull chamber 29 to grow the monocrystalline ingot I. The speed at which the pulling mechanism rotates the seed crystal C and the speed at which the pulling mechanism raises the seed crystal (i.e., the pull rate v) are controlled by the external control system. The general construction and operation of the crystal puller 23, except to the extent explained more fully below, is conventional and known by those of ordinary skill in the art.

Figure 2:
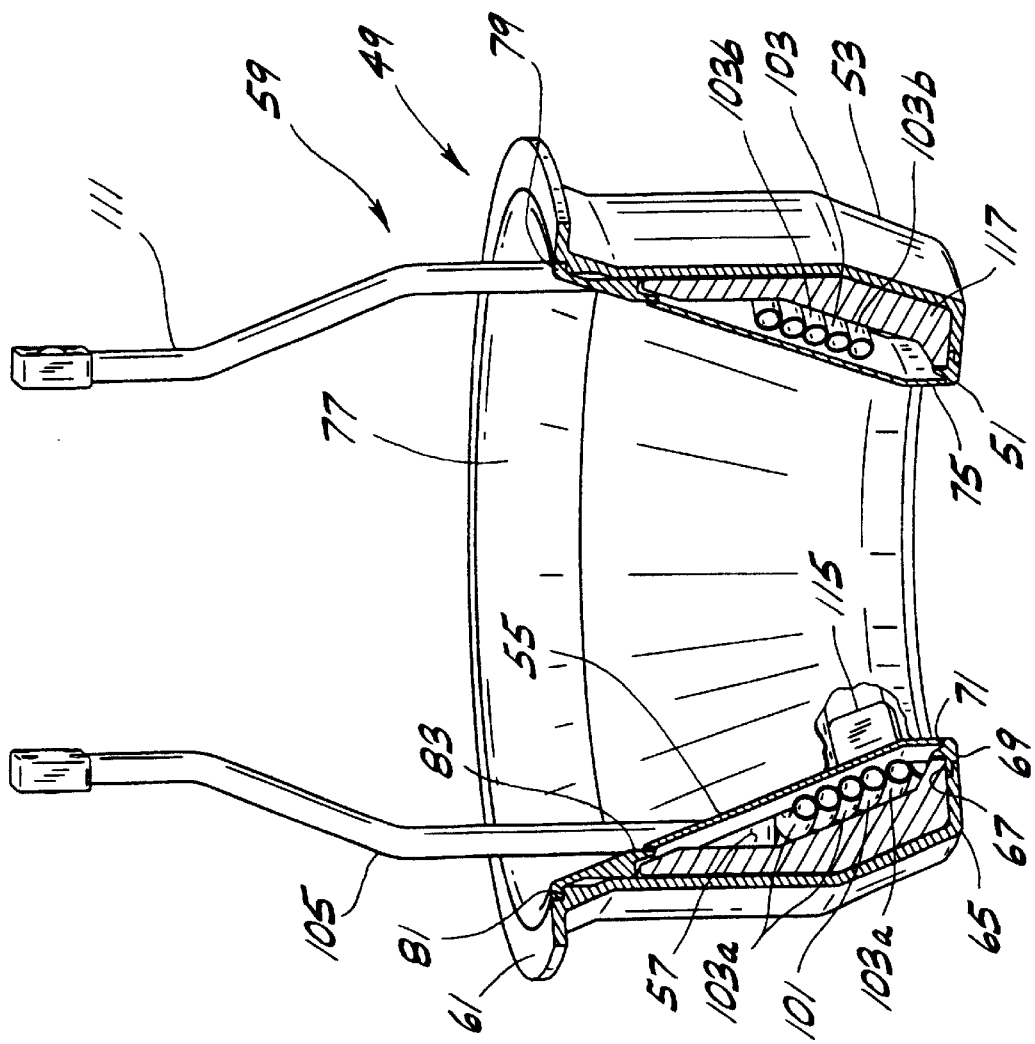
FIG. 2 is a perspective in partial section and with parts broken away of the heat shield assembly of FIG. 1.
Figure 3:
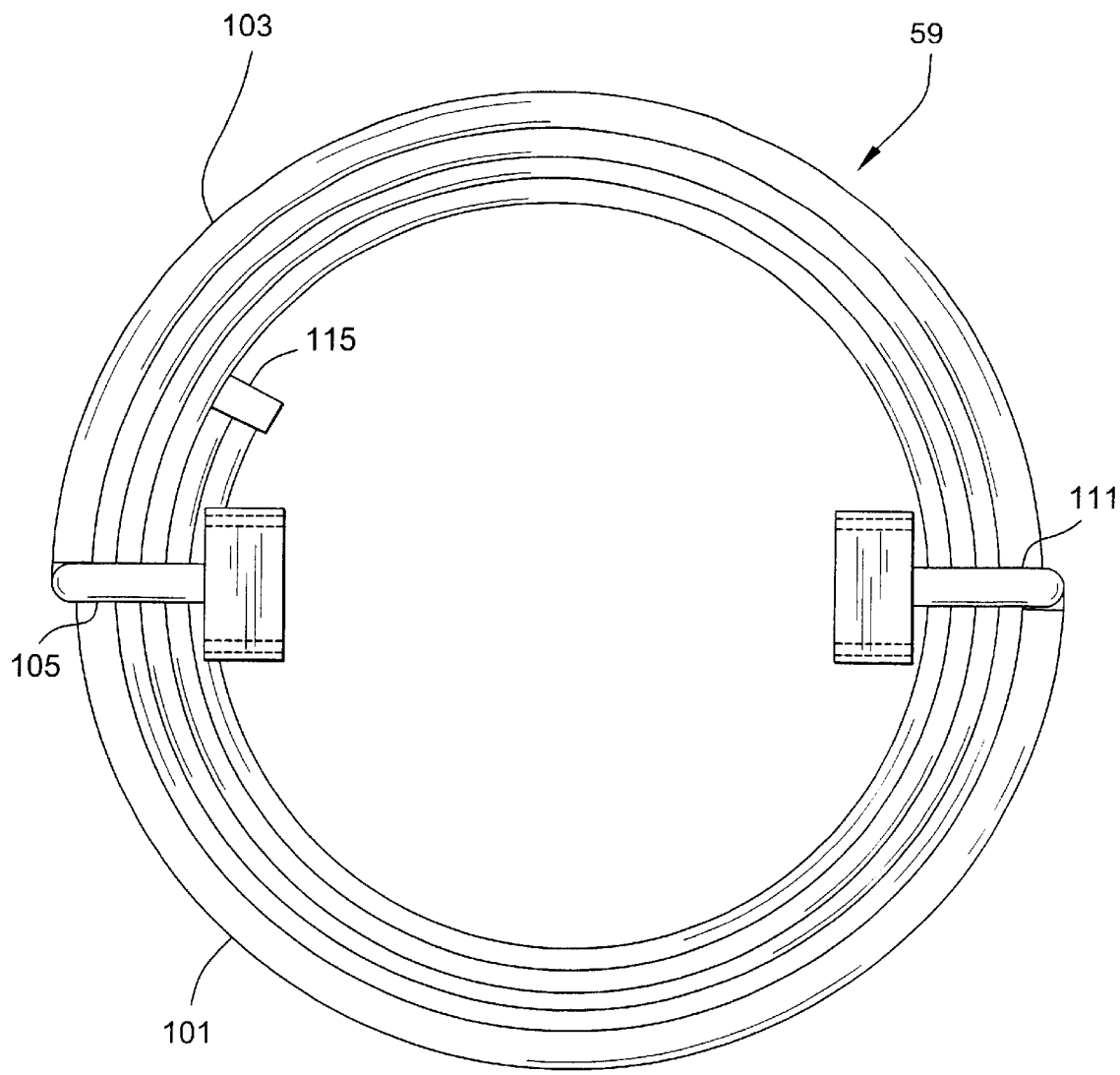
FIG. 3 is a top plan view of a cooling shield of the heat shield assembly of FIG. 1.

Referring to FIGS. 1 and 2, a heat shield assembly of the present invention, generally indicated at 49, is mounted in the growth chamber 27 above the molten source material M and has a central opening 51 sized and shaped to surround the ingot I as the ingot is pulled up from the source material. The heat shield assembly 51 generally comprises an outer reflector 53 and an inner shield panel 55 shaped and arranged relative to each other to define an interior chamber 57 therebetween. The assembly 51 also includes a cooling shield, generally indicated at 59, at least partially disposed within the interior chamber 57 for cooling the growing ingot I as it is pulled upward from the melt. The outer reflector 53 is tubular and has an annular flange 61 extending radially outward from its upper end. The outward extending flange 61 is sized for seating on an annular upper support ring 63 disposed in the growth chamber 27 for supporting the outer reflector (and hence the heat shield assembly as discussed further below) within the crystal puller 23. The outer reflector 53 extends downward from the annular flange 61 into the crucible 31 to a position above the melt surface of the source material M so that the outer reflector is at least partially interposed between the crucible side wall 33 and the growing ingot I.

A second, or lower annular flange 65 extends radially inward at the lower end of the outer reflector 53 to partially define a bottom surface of the heat shield assembly 49 in spaced relationship above the molten source material M. An annular ledge 67 is formed in the inner peripheral edge of the inward extending lower flange 65 for seating an annular lower support ring 69 of the outer reflector 53. The lower support ring 69 is configured at its outer peripheral edge for seating on the annular ledge 67 of the lower flange 65 of the outer reflector 53. An annular support ledge 71 is also formed in the inner peripheral edge of the lower support ring 69 of the outer reflector 53 for supporting the inner shield panel 55 in the crystal puller 23. The outer reflector 53, including the lower support ring 69, is preferably constructed of a graphite material, and more particularly of silicon carbide coated graphite. The lower support ring 69 has a central opening defining the central opening 51 of the heat shield assembly 49. As described above, the outer reflector 53 is of two-piece construction, with the lower support ring 69 being constructed separate from the remainder of the outer reflector, which is closer to the crucible side wall than the lower support ring, to inhibit heat conduction to the lower support ring from the remaining portion of the outer reflector. However, it is understood that the outer reflector 53 may be of unitary construction without departing from the scope of the invention.

As seen best in FIG. 2, the inner shield panel 55 comprises a generally funnel-shaped main portion 73 and a cylindrical lower portion 75 depending from the main portion and sized for seating on the annular support ledge 71 formed in the inner peripheral edge of the lower support ring 69 of the outer reflector 53. The lower support ring 69 of the outer reflector 53 thus supports the shield panel 55 in the crystal puller 23. The funnel-shaped main portion 73 of the shield panel 55 slopes upward and outward from the cylindrical lower portion 75 to a position slightly lower than the upper end of the outer reflector 53.

The inner shield panel 55 of the illustrated embodiment is preferably constructed of a material substantially transparent to radiant heat from the growing ingot I as the ingot is pulled upward through the heat shield assembly 49 so that the cooling shield 59 is substantially exposed to heat radiated from the ingot as the ingot is pulled upward from the molten source material. As used herein, transparent to radiant heat means having a transmittance equal to or greater than about 80% within at least a portion of the wavelength range of about 500 nanometers to about 2500 nanometers, and more preferably throughout this entire range. The Transmittance, as used herein, refers to the ability of light to transmit through the thickness of the inner shield panel 55. More particularly the term transmittance as used herein refers to a relative transmittance conventionally measured by directing a beam of light from a light source onto an incident target surface and measuring the electrical signal (e.g., voltage) of the incident light from the surface. An object is then interposed between the light source and the target surface and again the electrical signal of the incident light from the surface is measured. The relative transmittance is then the ratio of the electrical signal measured by directing the light through the object to the electrical signal measured without the object interposed between the light source and the target surface. The wavelength range of 500 nanometers to 2500 nanometers generally represents a light wavelength range that is most sensitive to light scattering effects and constitutes approximately 80% of the total wavelength range of heat radiated within the crystal puller 21. As an example, the inner shield panel 55 of the illustrated embodiment is constructed of clear fused quartz, which has transmittance of greater than about 90% within the disclosed wavelength range.

An annular guide ring 77, having a slightly funnel-shaped configuration, is supported in the crystal puller 23 by the outer reflector 53 for guiding (i.e., centering) the inner shield panel 55 into position on the annular support ledge 71 of the outer reflector. The upper end of the guide ring 77 has a radially outward extending flange 79 for seating on an annular shoulder 81 formed in the inner edge of the upper end of the outer reflector 53. The guide ring 77 slopes inward and downward from the outward extending flange 79 generally to the upper end of the inner shield panel 55 and further extends generally vertically downward intermediate the inner shield panel and the outer reflector 53. It is understood, however, that the guide ring 77 may be omitted without departing from the scope of the present invention.

The cooling shield 59 generally comprises a cooling tube 101 having a coil construction, with turns 103 of the cooling tube circumscribing the main portion 73 of the inner shield panel 55 in spaced relationship therewith. The turns 103 collectively define a generally frustoconical configuration in which the inner diameter of the cooling tube 101 increases from the lowermost turn to the uppermost turn in accordance with the slope of the main portion 73 of the shield panel 55 such that the spacing between the turns and the shield panel is generally constant along the height of the cooling tube. However, the inner diameter of the uppermost turn, broadly-defining an upper diameter of the cooling tube 101, is preferably substantially less than the outer diameter of the shield panel 55 at the top of the main portion 73 of the shield panel 55 for reasons which will become apparent.

An inlet tube 105 (FIG. 1) is connected to the cooling tube 101 in fluid communication therewith for directing cooling fluid, such as water, to the turns 103 of the cooling tube. The inlet tube 105 extends up from the turns 103 through a slot 107 in the main portion 73 of the inner shield panel 55 and is connected to an adapter ring 109 mounted on the housing 25 between the pull chamber 29 and the growth chamber 27 of the housing. The adapter ring 109 has an inlet (not shown) connected to a source of cooling fluid (not shown) to receive cooling fluid into the adapter ring for delivery within the adapter ring to the inlet tube 105. An outlet tube 111 is similarly connected to the turns 103 of the cooling tube 101 in fluid communication therewith for directing cooling fluid out of the cooling tube. The outlet tube 111 extends up from the turns 103 through another slot (not shown) in the main portion 73 of the inner shield panel 55 in spaced relationship with the slot 107 through which the inlet tube extends and is connected to the adapter ring 109 for exhausting cooling fluid from the housing 25 via an outlet (not shown) of the adapter ring.

In the illustrated embodiment, the cooling tube turns 103 include downward winding turns 103a in fluid communication with the inlet tube 105 for directing cooling fluid from the inlet tube down through the cooling tube 101. Upward winding turns 103b are in fluid communication with the downward winding turns 103a at the bottom of the cooling tube 101, such as by a suitable connector 115, for receiving cooling fluid from the downward winding turns and carrying the cooling fluid back up through the cooling tube. The upward winding turns 103b interstice with the downward winding turns 103a and are in fluid communication with the outlet tube 111 for exhausting cooling fluid from the cooling tube 101. The cooling tube 101 of the illustrated embodiment is constructed of steel. It is contemplated that the cooling shield 59 may be formed other than of a cooling tube 101, such as by being formed as an annular ring (not shown) or other plenum structure (not shown) that circumscribes all or part of the inner shield panel 55 without departing from the scope of this invention. It is also contemplated that the inner shield panel 55 may be omitted, so that the cooling shield is interposed between the outer reflector and the ingot and is directly exposed to the ingot without the intervening inner shield panel, and remain within the scope of this invention.

Insulation 117 constructed of a material having low thermal conductivity is contained in the interior chamber 57 intermediate the outer reflector 53 and the cooling tube 101 of the cooling shield 59 to insulate the turns 103 of the cooling tube against heat radiated by the outer reflector.

In a preferred method of installing the heat shield assembly 49 in the crystal puller 23, the pull chamber 29 is separated from the growth chamber 27 to provide access to the interior of the housing. The insulation 117 and outer reflector 53 are placed in the housing 25 with the annular flange 61 extending radially outward from the top of the reflector seating on the annular upper support ring 63 disposed in the growth chamber 27. The guide ring 77 is placed in the housing 25 with the flange 79 extending radially outward from the top of the guide ring seating on the annular shoulder 81 formed in the inner edge of the outer reflector 53. The inlet and outlet tubes 105, 111 are connected to the adapter ring 109 so that the inlet tube, outlet tube and cooling tube 101 depend from the adapter ring. Next, the inner shield panel 55 is positioned between the inlet and outlet tubes 105, 107 with the slots 107 in the main portion 73 of the shield panel respectively receiving the tubes therein. The shield panel 55 is then lowered down through the central opening 51 of the cooling tube 101. Since the upper diameter of the cooling tube 101 is less than the diameter of the top of the main portion 73 of the inner shield panel 55, the main portion of the shield panel rests on the uppermost coil of the cooling tube to permit installation of the inner shield panel and the cooling shield 59 into the crystal puller 23 as a single unit.

The adapter ring is mounted on the housing with the cooling shield 59 depending therefrom, thereby lowering the cooling shield down into the growth chamber 27 to position the cooling tube 101 generally adjacent the insulation material 117. If the inner shield panel 55 engages the guide ring 77 as it is lowered into the growth chamber 27, the guide ring properly orients the shield panel so that the cylindrical lower portion 75 of the shield panel is in generally axial alignment over the annular support ledge 71 formed at the inner peripheral edge of the lower flange 65 of the outer reflector 53. As the shield panel 55 is further lowered into the growth chamber 27, the lower portion 75 of the shield panel seats on the annular support ledge 71 so that the shield panel is supported in the housing 25 by the outer reflector 53 and defines the interior chamber 57 between the outer reflector and the shield panel. The cooling shield 59 is lowered further into the growth chamber until the adapter ring 109 seats on the housing 25 for connection thereto. In this position, the cooling tube 101 is disposed in the interior chamber 57 in spaced relationship with the shield panel 55 and the insulation 117 in the chamber. The pull chamber 29 is then mounted on the adapter ring 109 and the adapter ring is connected to the source of cooling fluid.

In operation, polycrystalline silicon is deposited in the crucible 31 and melted by heat radiated from the crucible heater 39. A seed crystal C is brought into contact with the molten silicon source material M and a monocrystalline ingot I is grown by slow extraction via the pulling mechanism. As the growing ingot I is pulled upward within the growth chamber 27, the crucible wall 33 is heated by the heater 39 and by the molten source material M in the crucible 31. Heat from the crucible wall 33 is radiated to the outer reflector 53. The insulation 117 in the interior chamber 57 inhibits heat radiated from the outer reflector 53 from radiating to the cooling tube 101 and shield panel 55. Spacing the coils 103 of the cooling tube 101 from the insulation 117 further inhibits heat transfer from the insulation to the cooling tube. As the ingot I is pulled upward into radial registry with the inner shield panel 55, heat radiated from the growing ingot radiates through the shield panel to the cooling tube 101.

Cooling fluid continuously flows down through the inlet tube 105 into the downward winding turns 103a such that heat from the growing ingot I radiated through the shield panel 55 is transferred to the cooling fluid in the coils instead of being radiated or reflected by the shield back toward the ingot. The cooling fluid flows down to the lowermost turn to the connector 115 and is then directed back up through the upward winding turns 103b to the outlet tube 111 for exhaustion from the cooling shield 59.

In view of the above, it will be seen that the several objects of the invention are achieved and other advantageous results attained. Providing a cooling shield 59 surrounding the growing ingot I as the ingot is pulled up from the molten silicon inhibits heat radiated from the ingot against being deflected or otherwise radiated back to the ingot. Thus, the ingot I is cooled more rapidly and, as a result, the pull rate of the crystal puller 23 can be substantially increased without distorting the growing ingot. The inner shield panel 55 shields the cooling shield 59 against molten silicon splash and also provides some protection of the cooling shield against inadvertent immersion of the heat shield assembly 49 in the molten silicon. However, constructing the inner shield 55 of a material that is substantially transparent to heat radiated from the growing ingot I allows the heat to be directed to the cooling shield 59 instead of reflecting or otherwise radiating the heat back toward the growing ingot.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A heat shield assembly for use in a crystal puller for growing a monocrystalline ingot from molten semiconductor source material, the crystal puller having a housing, a crucible contained in the housing for holding molten semiconductor source material, a heater in thermal communication with the crucible for heating the crucible to a temperature sufficient to melt the semiconductor source material held by the crucible and a pulling mechanism positioned above the crucible for pulling the ingot from the molten source material held by the crucible, the heat shield assembly being disposed above the molten source material and having a central opening sized and shaped for surrounding the ingot as the ingot is pulled from the molten source material, said heat shield comprising:
   an inner shield panel constructed of a material substantially transparent to radiant heat from the ingot; and
   a heat exchanger at least partially surrounding the inner shield panel such that the inner shield panel is disposed generally intermediate the heat exchanger and the ingot as the ingot is pulled from the molten source material, the inner shield panel material being substantially transparent to radiant heat to permit radiant heat from the ingot to radiate through the shield panel to the heat exchanger for increasing the rate at which the ingot is cooled, thereby increasing the axial temperature gradient of the ingot as the ingot is pulled from the molten source material.

2. A heat shield assembly as set forth in claim 1 wherein the inner shield panel is in radially spaced relationship with the heat exchanger.

3. A heat shield assembly as set forth in claim 2 further comprising an outer reflector interposed between the heat exchanger and the crucible, and wherein the inner shield panel and the outer reflector are shaped to define an annular chamber therebetween, the heat exchanger being disposed in the annular chamber.

4. A heat shield assembly as set forth in claim 3 further comprising insulation disposed in the annular chamber between the outer reflector and the heat exchanger to insulate the heat exchanger against heat radiated by the crucible.

5. A heat shield assembly as set forth in claim 2 wherein the inner shield panel and the heat exchanger are constructed for assembly with one another such that they can be simultaneously installed as a single unit in the crystal puller and simultaneously removed as a single unit from the puller.

6. A heat shield assembly as set forth in claim 5 wherein the inner shield panel is generally conical, the heat exchanger having an upper diameter substantially smaller than an upper diameter of the inner shield panel such that the heat exchanger engages and supports the inner shield panel upon installation of the heat exchanger and inner shield panel in the crystal puller and upon removal of the heat exchanger and inner shield panel from the crystal puller.

7. A heat shield assembly as set forth in claim 6 wherein the heat exchanger is a cooling tube of a coil construction having turns, the turns of the cooling tube being arranged such that the cooling tube has a generally conical configuration, the uppermost turn defining the upper diameter of the cooling tube.

8. A heat shield assembly as set forth in claim 2 further comprising an inlet tube in fluid communication with the heat exchanger, the inlet tube being in fluid communication with a source of cooling fluid for directing cooling fluid into the heat exchanger, and an outlet tube in fluid communication with the heat exchanger for exhausting cooling fluid from the heat exchanger.

9. A heat shield assembly as set forth in claim 8 in combination with the crystal puller, said crystal puller further comprising an adapter ring mounted on the housing, the inlet tube and the outlet tube being connected to the adapter ring in fluid communication therewith, said adapter ring being in fluid communication with the source of cooling fluid for receiving cooling fluid into the crystal puller and being adapted for directing the cooling fluid to flow through the inlet tube, said adapter ring further being adapted for receiving cooling fluid from the outlet tube and exhausting the cooling fluid from the crystal puller.

10. A heat shield assembly as set forth in claim 8 wherein inlet tube extends up from the heat exchanger through the inner shield panel for communication with the source of cooling fluid, the outlet tube extending up from the heat exchanger through the inner shield panel in spaced relationship with the inlet tube for exhausting cooling fluid from the crystal puller.

11. A crystal puller as set forth in claim 2 wherein the inner shield panel has a transmittance of at least about 90% within the wavelength range of about 500 to about 2500 nanometers.

12. A crystal puller as set forth in claim 11 wherein the inner shield panel is constructed of clear fused quartz.

13. A heat shield assembly as set forth in claim 1 wherein the heat exchanger is a cooling tube of a coil construction having turns, the turns of the cooling tube being arranged such that the cooling tube has a generally conical configuration, the uppermost turn defining the upper diameter of the cooling tube.

14. A crystal puller as set forth in claim 1 wherein the inner shield panel is constructed of quartz.

* * * * *